US012719345B2

(12) United States Patent
Yonezawa et al.

(10) Patent No.: US 12,719,345 B2
(45) Date of Patent: Aug. 25, 2026

(54) CURRENT DETECTION CIRCUIT

(71) Applicants: National University Corporation Tokai National Higher Education and Research System, Nagoya (JP); KOA CORPORATION, Ina (JP)

(72) Inventors: Yu Yonezawa, Aichi (JP); Masayoshi Yamamoto, Aichi (JP); Atsushi Hasenuma, Aichi (JP); Koji Shigesawa, Nagano (JP); Keishi Nakamura, Nagano (JP); Susumu Toyoda, Nagano (JP)

(73) Assignees: NATIONAL UNIVERSITY CORPORATION TOKAI NATIONAL HIGHER EDUCATION AND RESEARCH SYSTEM, Nagoya (JP); KOA CORPORATION, Ina (JP)

( * ) Notice: Subject to any disclaimer, the term of this patent is extended or adjusted under 35 U.S.C. 154(b) by 380 days.

(21) Appl. No.: 18/429,141

(22) Filed: Jan. 31, 2024

(65) Prior Publication Data

US 2024/0258897 A1 Aug. 1, 2024

(30) Foreign Application Priority Data

Jan. 31, 2023 (JP) ................................ 2023-012778

(51) Int. Cl.
*H02M 7/5387* (2007.01)
*H02M 1/00* (2006.01)
*H03F 3/45* (2006.01)

(52) U.S. Cl.
CPC ..... *H02M 1/0009* (2021.05); *H02M 7/53873* (2013.01); *H03F 3/45475* (2013.01); *H03F 2200/261* (2013.01); *H03F 2200/462* (2013.01)

(58) Field of Classification Search
CPC .. H02M 1/009; H02M 1/0003; H02M 1/0006; H02M 1/0012; H02M 1/0016;
(Continued)

(56) References Cited

U.S. PATENT DOCUMENTS

2007/0274015 A1* 11/2007 Isham .................. H02H 7/1227 361/93.1
2017/0356939 A1* 12/2017 Hurwitz ............... G01R 25/005
2020/0067430 A1* 2/2020 Wu ........................ G01D 5/145

FOREIGN PATENT DOCUMENTS

JP 2020-058230 A 4/2020

* cited by examiner

*Primary Examiner* — Nguyen Tran
(74) *Attorney, Agent, or Firm* — Jordan IP Law, LLC

(57) ABSTRACT

A current detection circuit, including: an output circuit to output a signal indicating a voltage drop between a pair of detection terminals; an amplifier circuit to amplify the signal from the output circuit; an AD conversion circuit to generate a digital signal by sampling, at a predetermined cycle, an amplified signal amplified by the amplifier circuit; a filter circuit configured to extract, from the amplified signal amplified by the amplifier circuit, a noise component having a frequency higher than a sampling frequency of the AD conversion circuit; a comparing unit to output a comparison signal indicating a noise detection timing at which an output signal of the filter circuit exceeds a predetermined reference value for detecting the noise component; and an arithmetic circuit to delay a timing at which the amplified signal is sampled by the AD conversion circuit for a predetermined time based on the comparison signal.

7 Claims, 8 Drawing Sheets

(58) Field of Classification Search
CPC ........... H02M 1/0025; H02M 7/53846; H02M 7/538463; H02M 7/538466; H02M 7/53854; H02M 7/53862; H02M 7/5387; H02M 7/53871; H02M 7/5388; H03F 3/45381; H03F 3/45475; H03F 3/45484
See application file for complete search history.

CURRENT DETECTION CIRCUIT

CROSS-REFERENCE TO RELATED APPLICATION

The present application claims priority 35 U.S.C. § 119 to Japanese Patent Publication No. JP 2023-012778 (filed on Jan. 31, 2023) which is hereby incorporated by reference in its entirety.

TECHNICAL FIELD

The present invention relates to a current detection circuit that detects a current.

BACKGROUND ART

JP2020-58230A discloses a current detection device in which a voltage generated across a shunt resistor is amplified by an amplifier circuit, and an analog signal thereof is sampled at a predetermined timing and converted into a digital signal.

SUMMARY OF INVENTION

The above-described current detection circuit may sample an analog signal at a time point when high-frequency noise such as switching noise generated in an inverter is superimposed, and such a digital signal includes a current detection value including the high-frequency noise. As described above, there is a problem that the current detection value indicated in time series in the digital signal includes an error caused by the high-frequency noise.

The present invention has been made in view of such a problem, and an object of the present invention is to suppress an influence of high-frequency noise received when detecting a current.

According to an aspect of the present invention, a current detection circuit includes: an output circuit configured to output a signal indicating a voltage drop between a pair of detection terminals for detecting a current; an amplifier circuit configured to amplify the signal from the output circuit; and a conversion circuit configured to generate a digital signal by sampling, at a predetermined cycle, an amplified signal amplified by the amplifier circuit. Further, the current detection circuit includes: a filter circuit configured to extract, from the amplified signal, a noise component having a frequency higher than a sampling frequency of the conversion circuit; and a comparing unit configured to output a comparison signal indicating a noise detection timing at which an output signal of the filter circuit exceeds a predetermined reference value for detecting the noise component. Further, the current detection circuit includes an arithmetic circuit configured to delay a timing at which the amplified signal is sampled by the conversion circuit for a predetermined time based on the comparison signal.

According to the aspect, in a case where the output signal of the filter circuit exceeds the predetermined reference value when the conversion circuit samples the amplified signal, a sampling timing thereof can be delayed by the predetermined time from the timing defined by the predetermined cycle.

Accordingly, the amplified signal can be sampled so as to avoid the noise detection timing. Therefore, it is possible to suppress the influence of the high-frequency noise received when detecting a current.

DESCRIPTION OF EMBODIMENTS

Figure 1:
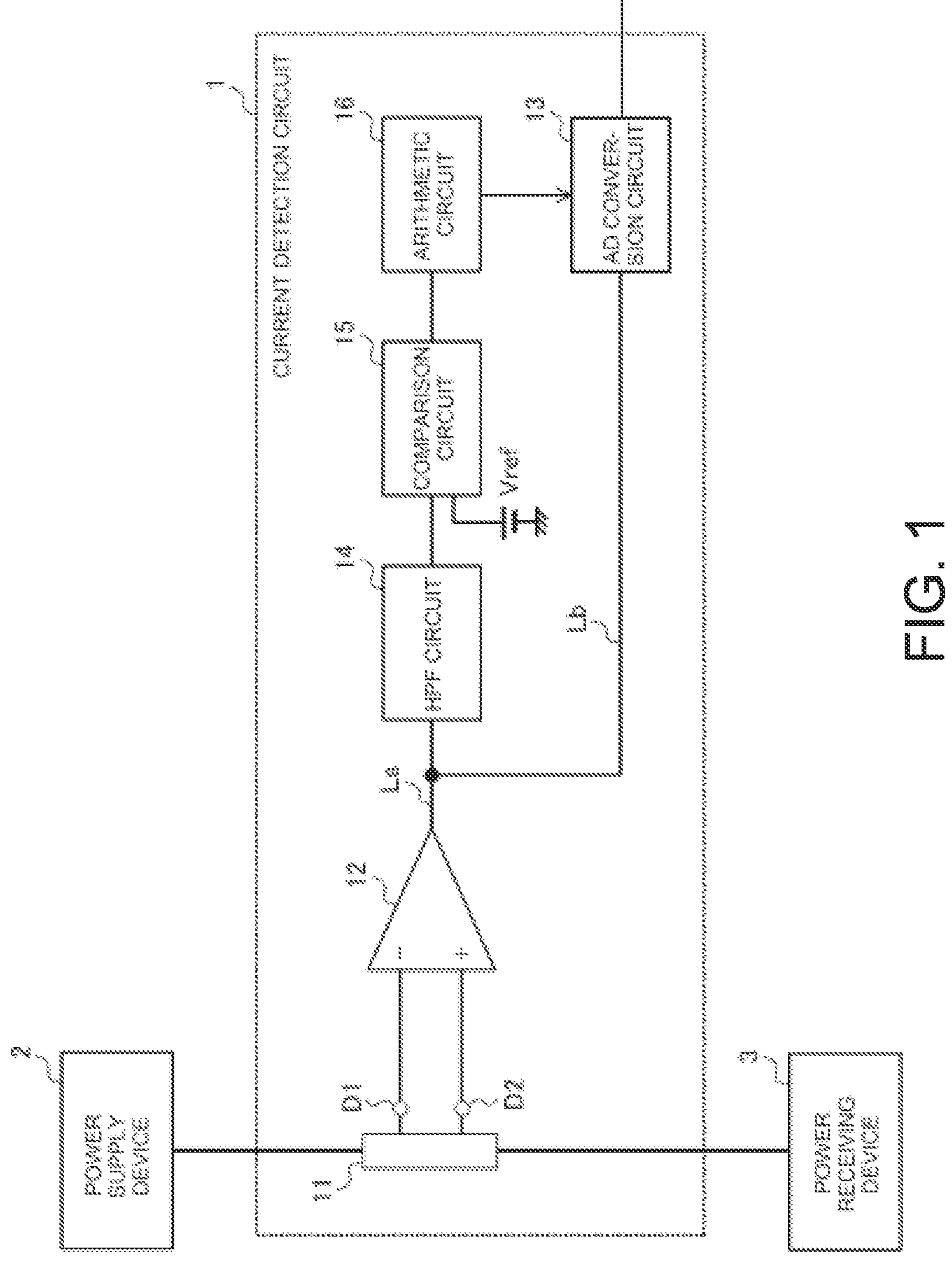
FIG. 1 is a diagram illustrating a circuit configuration of a current detection circuit according to a first embodiment of the present invention.

Hereinafter, embodiments of the present invention will be described with reference to the accompanying drawings. In the present description, the same or equivalent elements are denoted by the same reference numerals throughout the entire structure.

First, a configuration of a current detection circuit according to a first embodiment of the present invention will be described with reference to FIG. 1.

FIG. 1 is a diagram illustrating a configuration of a current detection circuit 1 according to the present embodiment.

The current detection circuit 1 is, for example, a circuit that detects a current flowing through an electric path such as a power supply line or a signal line connecting devices. In the present embodiment, the current detection circuit 1 detects a current flowing between a power supply device 2 that supplies power and a power receiving device 3 that receives the power supplied from the power supply device 2.

The current detection circuit 1 includes a resistor 11, an amplifier circuit 12, an AD conversion circuit 13, an HPF circuit 14, a comparison circuit 15, an arithmetic circuit 16, a signal line Ls, and a branch line Lb.

The resistor 11 functions as an output circuit that outputs a detection signal indicating a voltage drop occurring between a pair of detection terminals D1 and D2 for detecting a current flowing through the resistor 11 itself. The resistor 11 is, for example, a shunt resistor having a resistive element, and in this example, the detection terminals D1 and D2 are respectively connected to a pair of electrodes connected to both ends of the resistive element.

The amplifier circuit 12 amplifies the detection signal output from the resistor 11. The amplifier circuit 12 outputs an amplified signal, which is the amplified detection signal, to the HPF circuit 14 and the AD conversion circuit 13. In the amplifier circuit 12, as an amplification factor of an input detection signal increases, high-frequency noise superimposed on the amplified signal increases.

The signal line Ls connects the amplifier circuit 12 and the HPF circuit 14, and transmits the amplified signal output from the amplifier circuit 12. The branch line Lb is a signal line branched from the signal line Ls, and transmits the amplified signal output from the amplifier circuit 12 as a branch signal to the AD conversion circuit 13.

Hereinafter, the amplified signal transmitted to the AD conversion circuit 13 via the branch line Lb obtained by branching the signal line Ls is referred to as a "main signal", and the amplified signal transmitted to the HPF circuit 14 via the signal line Ls is referred to as a "reference signal".

The AD conversion circuit 13 functions as a conversion circuit that samples, at a predetermined cycle, the main signal transmitted to the branch line Lb to convert the main signal from an analog signal to a digital signal. In the digital signal, current detection values as sampled values are indicated in time series.

The predetermined cycle is a sampling cycle determined in advance, and is, for example, about several tens of [KHz], and is set to 50 [KHz] or 60 [KHz] in the present embodiment. The AD conversion circuit 13 outputs a converted digital signal.

The HPF circuit 14 functions as a filter circuit that extracts high-frequency noise from the reference signal transmitted to the branched signal line Ls. In the present embodiment, the high-frequency noise refers to a noise component having a frequency higher than a sampling frequency of the AD conversion circuit 13.

The HPF circuit 14 is implemented by, for example, a high-pass filter. Examples of the high-frequency noise passing through the HPF circuit 14 include noise caused by an amplification operation in the amplifier circuit 12 and switching noise.

A cutoff frequency of the HPF circuit 14 is designed such that the high-frequency noise passes therethrough, and is set to, for example, several [MHz]. The HPF circuit 14 outputs a signal from which the noise component having a high frequency is extracted to the comparison circuit 15.

The comparison circuit 15 functions as a comparing unit that outputs a comparison signal indicating a noise detection timing at which the output signal of the HPF circuit 14 exceeds a predetermined reference value Vref for detecting the above-mentioned noise component.

In the present embodiment, the comparison circuit 15 is implemented by a comparator that compares the output signal of the HPF circuit 14 with the reference value Vref. The reference value Vref is a value of a voltage generated by a reference power supply.

The comparison circuit 15 generates, as the comparison signal, a High signal indicating a noise detection timing when the output signal of the HPF circuit 14 exceeds the reference value Vref, and generates a Low signal when the output signal of the HPF circuit 14 is equal to or less than the reference value Vref.

In a specific example, the comparison circuit 15 sets the High signal to "1" and the Low signal to "0", and generates the comparison signal with a digital value including two logical values. The comparison circuit 15 outputs the comparison signal including the High signal and the Low signal to the arithmetic circuit 16.

The arithmetic circuit 16 delays a timing at which the main signal is sampled by the AD conversion circuit 13 by a predetermined time based on the comparison signal output from the comparison circuit 15. The predetermined time is a delay time determined to avoid the high-frequency noise, and may be longer or shorter than the sampling cycle of the AD conversion circuit 13.

In the present embodiment, the predetermined time for delaying the sampling is a minute time shorter than the sampling cycle of the AD conversion circuit 13, and is set to, for example, several tens of [ns] or several hundreds of [ns].

The arithmetic circuit 16 is implemented by a processor that controls an operation of the AD conversion circuit 13 so as to cause the sampling timing in the AD conversion circuit 13 to shift by a minute time with respect to the timing defined according to the sampling cycle of the AD conversion circuit 13.

Examples of the processor include a central processing unit (CPU) and a micro processor unit (MPU). The comparison signal output from the comparison circuit 15 is input to the arithmetic circuit 16 via, for example, a general purpose input/output (GPIO).

In the present embodiment, the arithmetic circuit 16 determines whether the defined timing defined according to the sampling cycle determined in advance matches the noise detection timing indicated by the comparison signal.

In a case where it is determined that the defined timing coincides with the noise detection timing, the arithmetic circuit 16 instructs the AD conversion circuit 13 to delay the sampling timing by the minute time from the defined timing. Accordingly, the AD conversion circuit 13 samples the main signal so as to avoid the noise detection timing.

On the other hand, in a case where it is determined that the defined timing does not coincide with the noise detection timing, the arithmetic circuit 16 instructs the AD conversion circuit 13 not to delay the sampling timing. Accordingly, the AD conversion circuit 13 samples the main signal at the defined timing.

Next, a connection configuration of the current detection circuit 1 will be briefly described.

The detection terminals D1 and D2 of the resistor 11 are connected to the amplifier circuit 12 in a next stage. In the embodiment illustrated in FIG. 1, the detection terminal D1 of the resistor 11 is connected to an inverting input terminal (−) of the amplifier circuit 12, and the detection terminal D2 of the resistor 11 is connected to a non-inverting input terminal (+) of the amplifier circuit 12. A polarity of the input terminals of the amplifier circuit 12 to which the resistor 11 is connected may be different from that of the example illustrated in FIG. 1. In addition, an input resistor or the like may be connected between the resistor 11 and the amplifier circuit 12.

An output terminal of the amplifier circuit 12 is connected to an input terminal of the AD conversion circuit 13 and an input terminal of the HPF circuit 14. An output terminal of the HPF circuit 14 is connected to a non-inverting input terminal of the comparison circuit 15, an output terminal of the reference power supply is connected to an inverting input terminal of the comparison circuit 15, and an output terminal of the comparison circuit 15 is connected to an input terminal of the arithmetic circuit 16.

Although the HPF circuit 14 and the comparison circuit 15 in the present embodiment are configured as analog circuits, functions of the HPF circuit 14 and the comparison circuit 15 may be realized in digital processing of the arithmetic circuit 16.

Next, an operation of the current detection circuit 1 according to the present embodiment will be described with reference to FIG. 2.

Figure 2:
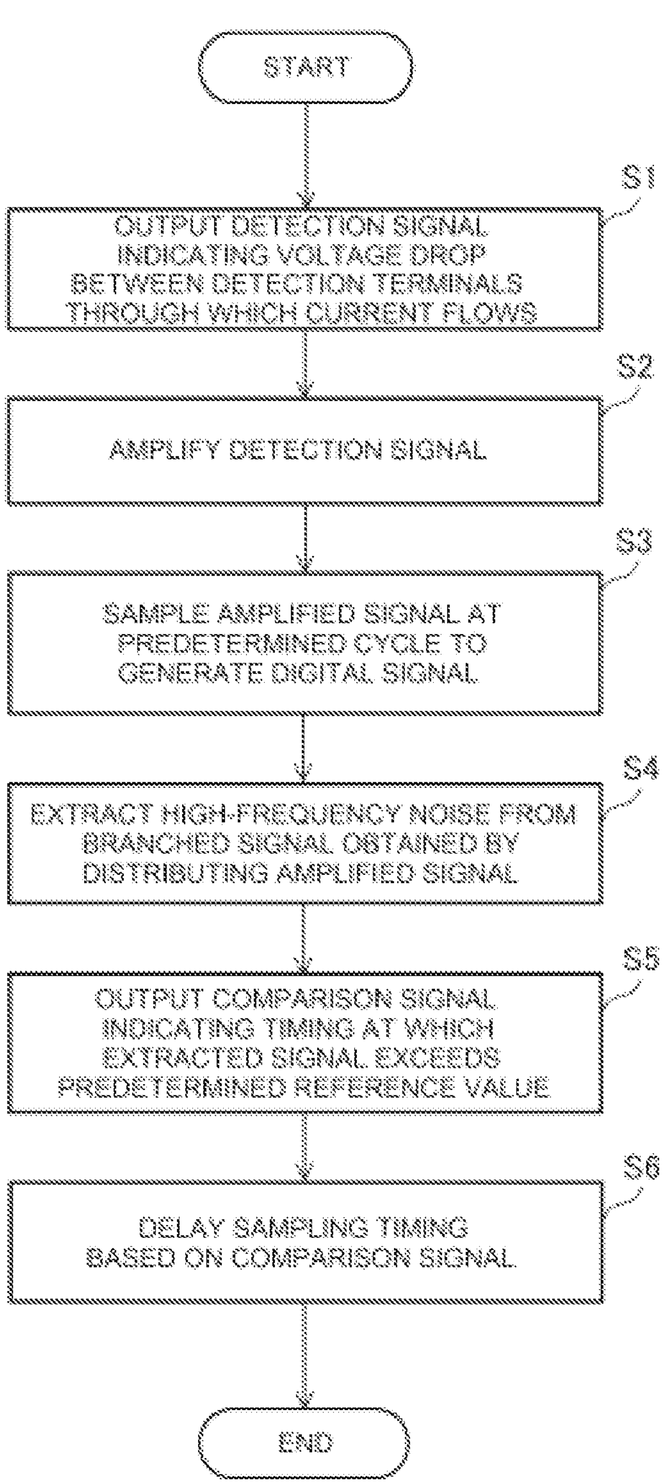
FIG. 2 is a flowchart illustrating a current detection method according to the first embodiment.

FIG. 2 is a flowchart illustrating an example of a current detection method by the current detection circuit 1.

In step S1, the resistor 11 outputs a detection signal indicating a voltage drop occurring between the pair of detection terminals D1 and D2.

In step S2, the amplifier circuit 12 amplifies the detection signal output from the resistor 11.

In step S3, the AD conversion circuit 13 samples, at a predetermined cycle, the main signal transmitted to the branch line Lb branched from the signal line Ls transmitting the amplified signal amplified by the amplifier circuit 12 to generate a digital signal.

In step S4, the HPF circuit 14 extracts a noise component having a frequency higher than the sampling frequency of the AD conversion circuit 13 from the reference signal transmitted to the branched signal line Ls.

In step S5, the comparison circuit 15 outputs a comparison signal indicating a noise detection timing at which the output signal of the HPF circuit 14 exceeds the predetermined reference value Vref for detecting the above-mentioned noise component.

In step S6, the arithmetic circuit 16 delays the timing at which the main signal is sampled by the AD conversion circuit 13 by a predetermined time shorter than a predetermined cycle set in the AD conversion circuit 13 based on the comparison signal output from the comparison circuit 15.

When the process of step S6 is completed, a series of process procedures relating to the current detection method ends.

Next, functions and effects of the first embodiment will be described.

In the present embodiment, the current detection circuit 1 includes: the resistor 11 as the output circuit that outputs the detection signal indicating a voltage drop between the pair of detection terminals D1 and D2 for detecting a current; the amplifier circuit 12 that amplifies the detection signal from the resistor 11; and the AD conversion circuit 13 that generates the digital signal by sampling the amplified signal amplified by the amplifier circuit 12 as the main signal at the predetermined cycle.

Further, the current detection circuit 1 includes the HPF circuit 14 as the filter circuit that extracts the noise component having a frequency higher than the sampling frequency of the AD conversion circuit 13 from the amplified signal transmitted as the reference signal from the branched signal line Ls. The above-mentioned reference signal is the amplified signal amplified by the amplifier circuit 12.

Further, the current detection circuit 1 includes the comparison circuit 15 as the comparing unit that outputs a comparison signal indicating a noise detection timing at which the output signal of the HPF circuit 14 exceeds the predetermined reference value Vref for detecting the above-mentioned noise component. Further, the current detection circuit 1 includes the arithmetic circuit 16 that delays the timing at which the main signal is sampled by the AD conversion circuit 13 by a predetermined time based on the comparison signal output from the comparison circuit 15.

According to the configuration, in a case where the output signal of the HPF circuit 14 exceeds the predetermined reference value when the AD conversion circuit 13 samples the main signal, a sampling timing thereof can be delayed by the predetermined time from the timing defined by the predetermined cycle.

For example, the high-frequency noise may be superimposed on the output signal in the amplifier circuit 12. In this case, when the high-frequency noise is extracted in the HPF circuit 14, the output signal of the HPF circuit 14 exceeds the predetermined reference value Vref, and the comparison signal indicating the timing at which the high-frequency noise is superimposed on the reference signal is generated in the comparison circuit 15. The arithmetic circuit 16 delays the sampling timing by the AD conversion circuit 13 using the comparison signal.

As described above, according to the above-mentioned configuration, since the main signal can be sampled so as to avoid the noise detection timing indicated by the comparison signal, it is possible to suppress the influence of the high-frequency noise received when detecting a current.

According to the above-mentioned configuration, in order to change the sampling timing such that the high-frequency noise is not sampled, the high-frequency noise is extracted using the HPF circuit 14. On the other hand, as a countermeasure against the high-frequency noise, it is common to remove the high-frequency noise using an LPF circuit and sample a signal from which the high-frequency noise has been removed. In such a configuration, since the LPF circuit functions as an integration circuit, a signal delay occurs in the LPF circuit.

On the other hand, the above-mentioned configuration of the present embodiment changes the sampling timing in order to suppress the influence of the high-frequency noise, and does not require an LPF circuit that causes a signal delay. Therefore, the signal delay can be suppressed as compared with a circuit configuration of a general high-frequency noise countermeasure using an LPF circuit. Therefore, in a case where a current control is executed on the power supply device 2, a current flowing between the power supply device 2 and the power receiving device 3 can be accurately controlled.

The comparison circuit 15 in the present embodiment is a comparator that outputs a comparison signal as a digital value including 0 and 1 when the output signal of the HPF circuit 14 exceeds the predetermined reference value Vref.

According to the configuration, it is not necessary to convert the comparison signal from an analog signal to a digital signal, and an error caused by sampling of the noise detection timing does not occur. Therefore, by accurately specifying a generation timing of the high-frequency noise, the high-frequency noise can be accurately avoided when the main signal is sampled. Accordingly, the influence of the high-frequency noise can be suppressed.

In the present embodiment, the predetermined time for delaying the sampling timing is set to a time interval shorter than the predetermined cycle set in the AD conversion circuit 13. Accordingly, since a sampling interval does not become equal to or longer than two cycles of the predetermined sampling cycle, even when the current rapidly fluctuates, the current fluctuation can be accurately reproduced in the digital signal.

Next, a current detection circuit 1 according to a second embodiment will be described with reference to FIG. 3.

In the present embodiment, the current detection circuit 1, the power supply device 2, and the power receiving device 3 are mounted on a vehicle such as an electric automobile or a hybrid vehicle.

The power supply device 2 is a switching circuit that executes a switching operation using a switching element. Examples of the power conversion device configured by the switching circuit include an inverter, a converter, and a bridge circuit.

In the present embodiment, the power supply device 2 is a three-phase inverter, and the power receiving device 3 is a three-phase AC motor that is driven by a three-phase current supplied from the three-phase inverter.

Figure 3:
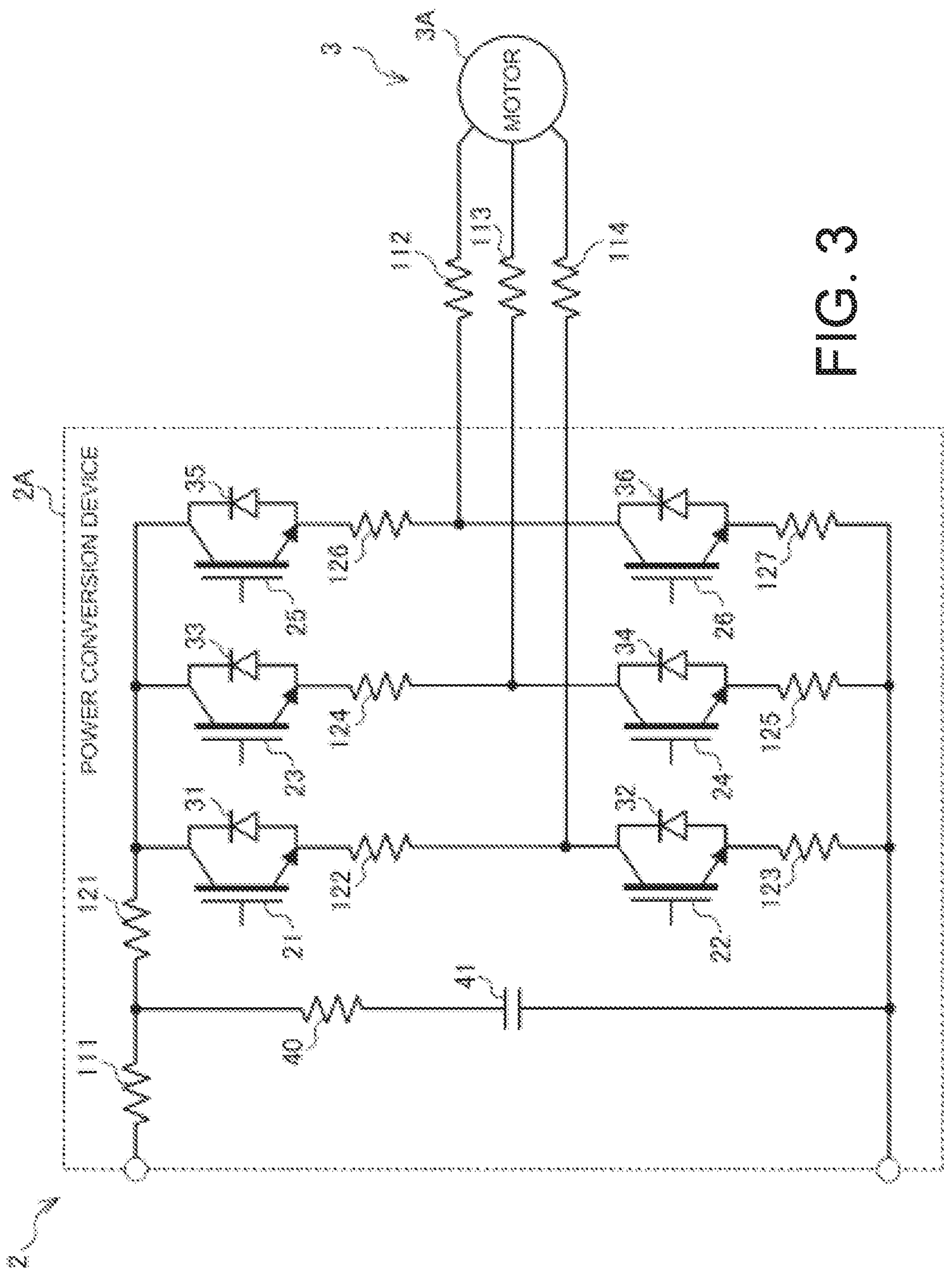
FIG. 3 is a circuit diagram illustrating a power supply device according to a second embodiment.

FIG. 3 is a circuit diagram illustrating a circuit configuration of the power supply device 2 according to the second embodiment.

In the present embodiment, the power supply device 2 is a power conversion device 2A configured by a three-phase inverter, and the power receiving device 3 is a motor 3A configured by a three-phase AC motor.

The power conversion device 2A includes switching elements 21 to 26, diodes 31 to 36, a noise filter including a resistor 40 and a smoothing capacitor 41, resistors 111 to 114, and current detection resistors 121 to 127.

The switching elements 21 to 26 are active elements that execute switching operations of on and off, and are implemented by, for example, a semiconductor device such as a transistor. In the present embodiment, the switching elements 21 to 26 are insulated gate bipolar transistors (IGBTs).

The diodes 31 to 36 are reflux diodes for protecting the switching elements 21 to 26. The diodes 31 to 36 are respectively arranged such that an orientation of a current flowing through the switching elements 21 to 26 is opposite to that of a forward current.

The resistors 111 to 114 correspond to the resistor 11 constituting the current detection circuit 1 illustrated in FIG. 1. Each of the resistors 111 to 114 outputs a detection signal indicating a voltage drop occurring between the pair of detection terminals D1 and D2. The resistor 111 detects an input current of the power conversion device 2A, and the resistors 112 to 114 detect an output current from the power conversion device 2A.

The pair of detection terminals D1 and D2 of each of the resistors 111 to 114 can be connected to a pair of input terminals of the amplifier circuit 12 constituting the current detection circuit 1 illustrated in FIG. 1, respectively. For example, a plurality of current detection circuits 1 may be prepared, and one current detection circuit 1 may be disposed for each resistor.

Alternatively, a multi-input single-output connection switch may be prepared, the pair of input terminals of the amplifier circuit 12 may be connected to an output terminal of the connection switch, and the pair of detection terminals D1 and D2 of the resistors 111 to 114 may be connected to the respective input terminals of the connection switch.

Irregular switching noise caused by the switching operation of the switching elements 21 to 26 is superimposed as high-frequency noise on the current flowing through the resistors 111 to 114.

The power conversion device 2A mounted on the vehicle supplies a large current to the motor 3A during acceleration or the like. In this case, in order to suppress heat generation of the resistors 111 to 114, each of resistance values of the resistors 111 to 114 is set to a low resistance value of about several tens of [μΩ] to several hundreds of [μΩ], for example. That is, the resistors 111 to 114 are implemented by shunt resistors having low resistance values.

On the other hand, the amplification factor of the amplifier circuit 12 of the current detection circuit 1 needs to be increased by an amount by which each of the resistance values of the resistors 111 to 114 is decreased. Therefore, high-frequency noise accompanying a resistance reduction of the resistors 111 to 114 is superimposed on the amplified signal output from the amplifier circuit 12.

The current detection resistors 121 to 127 are resistors for detecting a current, correspond to the resistor 11 illustrated in FIG. 1, and output a detection signal indicating a voltage drop occurring between the pair of detection terminals D1 and D2. In the present embodiment, a detection signal for detecting an overcurrent is used as an example, but the detection signal is also used for control such as turning off the switching elements 21 to 26. The resistors 121 to 127 detect an internal current of the power conversion device 2A.

In each of the resistors 121 to 127, the pair of detection terminals D1 and D2 can be connected to the pair of input terminals of the amplifier circuit 12 constituting the current detection circuit 1, respectively, similarly to the resistors 111 to 114. In this manner, the current detection circuit 1 can also detect an overcurrent flowing through the resistors 121 to 127.

As described above, in the second embodiment, the current detection circuit 1 detects a three-phase alternating current flowing between the power conversion device 2A and the motor 3A, or a current flowing through the switching elements 21 to 26 of the power supply device 2.

Next, the resistors 112 to 114 as the output circuit that outputs a detection signal indicating a voltage drop between the detection terminals D1 and D2 will be described with reference to FIGS. 4A and 4B. Since the resistors 112 to 114 have the same structure, only a structure example of the resistor 112 is illustrated in FIGS. 4A and 4B.

Figure 4A:
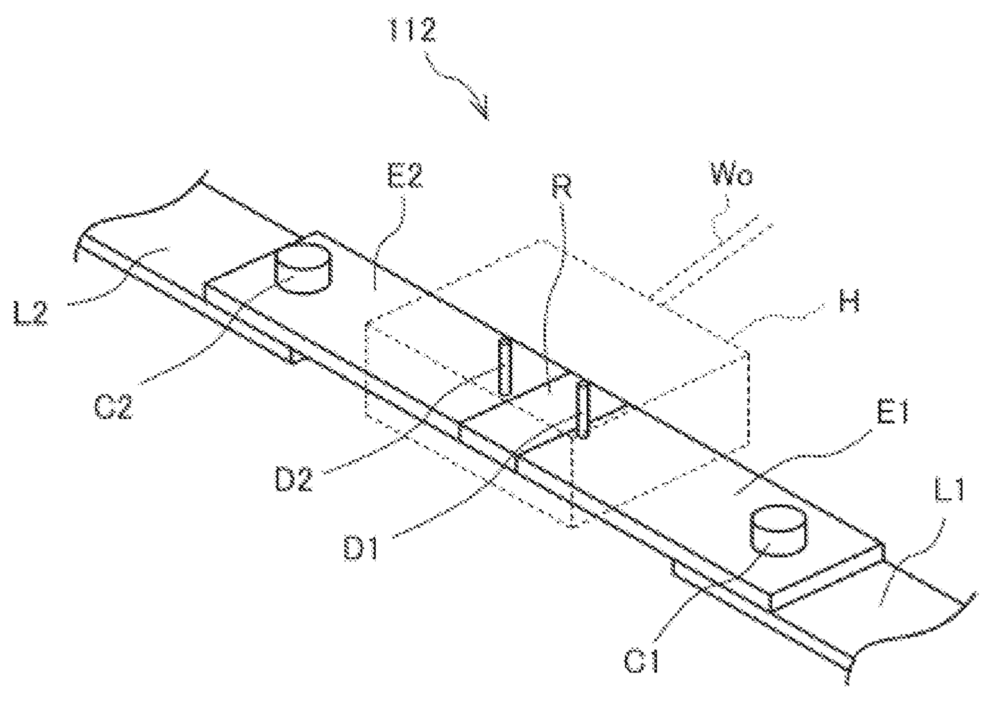
FIG. 4A is a perspective diagram illustrating an example of a structure of a resistor.
Figure 4B:
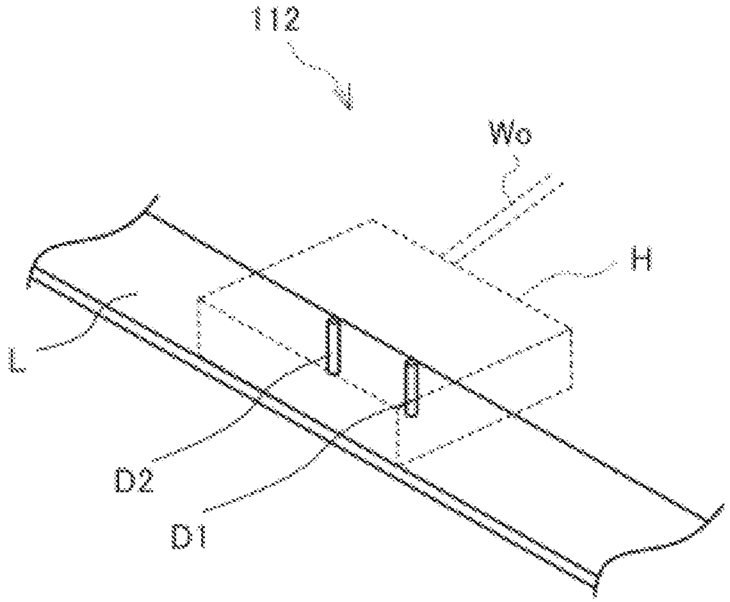
FIG. 4B is a perspective diagram illustrating a modification of the structure of the resistor.

FIG. 4A is a perspective diagram illustrating the structure example of the resistor 112.

As illustrated in FIG. 4A, the resistor 112 includes a resistive element R, a pair of electrode plates E1 and E2 connected to both ends of the resistive element R, and a pair of rod-shaped detection terminals D1 and D2 protruding from the vicinity of the resistive element R on surfaces of the pair of electrode plates E1 and E2.

The electrode plate E1 is fastened to a wiring L1 by a fastening portion C1, and the electrode plate E2 is fastened to a wiring L2 by a fastening portion C2. The pair of detection terminals D1 and D2 are accommodated in a case, and an output signal wiring Wo extended from the case includes a signal line connected to the pair of detection terminals D1 and D2.

The resistive element R is a current detection unit for converting a current into a voltage drop, and is formed of, for example, nichrome, copper-manganese, or copper-nickel. The pair of electrode plates E1 and E2 and the detection terminals D1 and D2 are output units for outputting a detection signal indicating a voltage drop, and are formed of, for example, copper or aluminum. The pair of electrode plates E1 and E2 are formed of a metal plate.

As described above, by adopting the plate-shaped resistor 112 as the output circuit that outputs the detection signal indicating a voltage drop between the pair of detection terminals D1 and D2, it is possible to reduce the height of the output circuit.

FIG. 4B is a perspective diagram illustrating a modification of the structure of the resistor 112.

The resistor 112 of the modification illustrated in FIG. 4B omits the resistive element R illustrated in FIG. 4A, and is formed of one wiring L and a pair of rod-shaped detection terminals D1 and D2 protruding from the wiring L. The wiring L is a so-called bus bar, and is formed of a metal plate. A portion of the wiring L between the detection terminals D1 and D2 corresponds to the current detection unit.

The pair of detection terminals D1 and D2 are accommodated in a case, and an output signal wiring Wo extended from the case includes a signal line connected to the pair of detection terminals D1 and D2.

The resistor 112 according to the modification uses a resistance component between the detection terminals D1 and D2 on the wiring L with the resistive element R being omitted. In the resistor 112, it is possible to reduce a resistance value of the resistor 112 as compared with the structure illustrated in FIG. 4A while achieving height reduction.

A large current may be supplied from the power conversion device 2A to the motor 3A mounted on the vehicle at the time of acceleration of the vehicle or the like, and in such a case, a large current flows through the resistor 112. Even in such a situation, since the resistance value of the resistor 112 is low, the heat generation in the resistor 112 can be suppressed.

As illustrated in FIGS. 4A and 4B, the resistor 112 is formed of a metal plate to achieve the height reduction.

Next, an application example of the current detection circuit 1 according to the present embodiment will be described with reference to FIGS. 4 and 5.

Figure 5:
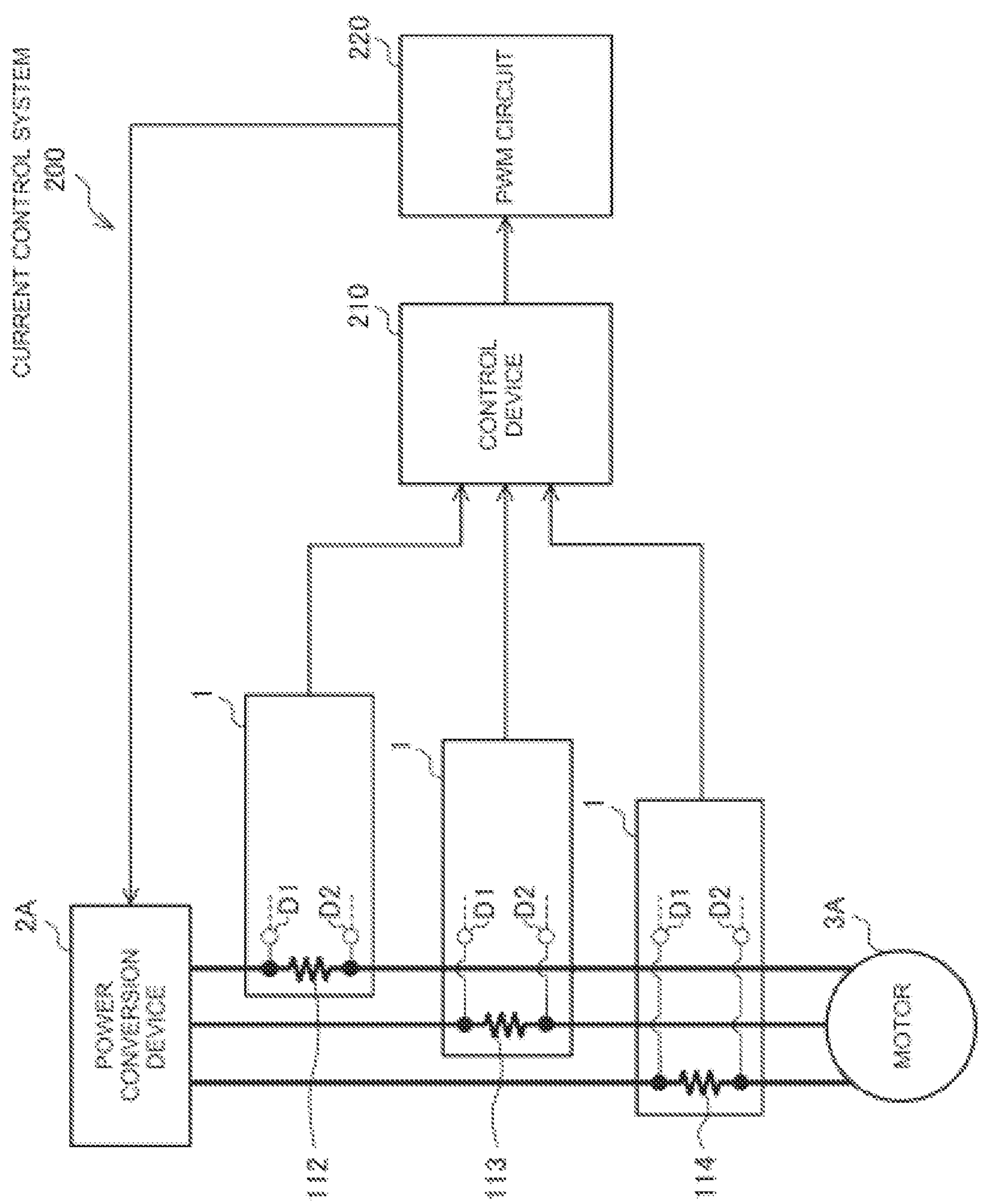
FIG. 5 is a diagram illustrating a first application example of the current detection circuit.

FIG. 5 is a diagram illustrating a first application example of the current detection circuit 1. The current detection circuit 1 in this example is applied to a current control system 200 of the power conversion device 2A.

In the first application example, the current control system 200 includes three current detection circuits 1, a current control device 210, and a PWM circuit 220.

The three current detection circuits 1 detect three-phase alternating currents flowing through the resistors 112 to 114 illustrated in FIG. 3, respectively. Each of the three current detection circuits 1 outputs a digital signal indicating a current detection value of a three-phase alternating current to the current control device 210.

The current control device 210 controls the three-phase alternating current supplied from the power conversion device 2A to the motor 3A using vector control. For example, the current control device 210 outputs a three-phase control signal for generating a PWM signal to the PWM circuit 220 based on a torque command value to the motor 3A and digital signals output from the three current detection circuits 1.

The PWM circuit 220 generates a PWM signal based on the three-phase control signal output from the current control device 210 and supplies the PWM signal to the power supply device 2 constituting the three-phase inverter.

Next, detection accuracy of the current detection circuit 1 will be described with reference to FIG. 6.

Figure 6:
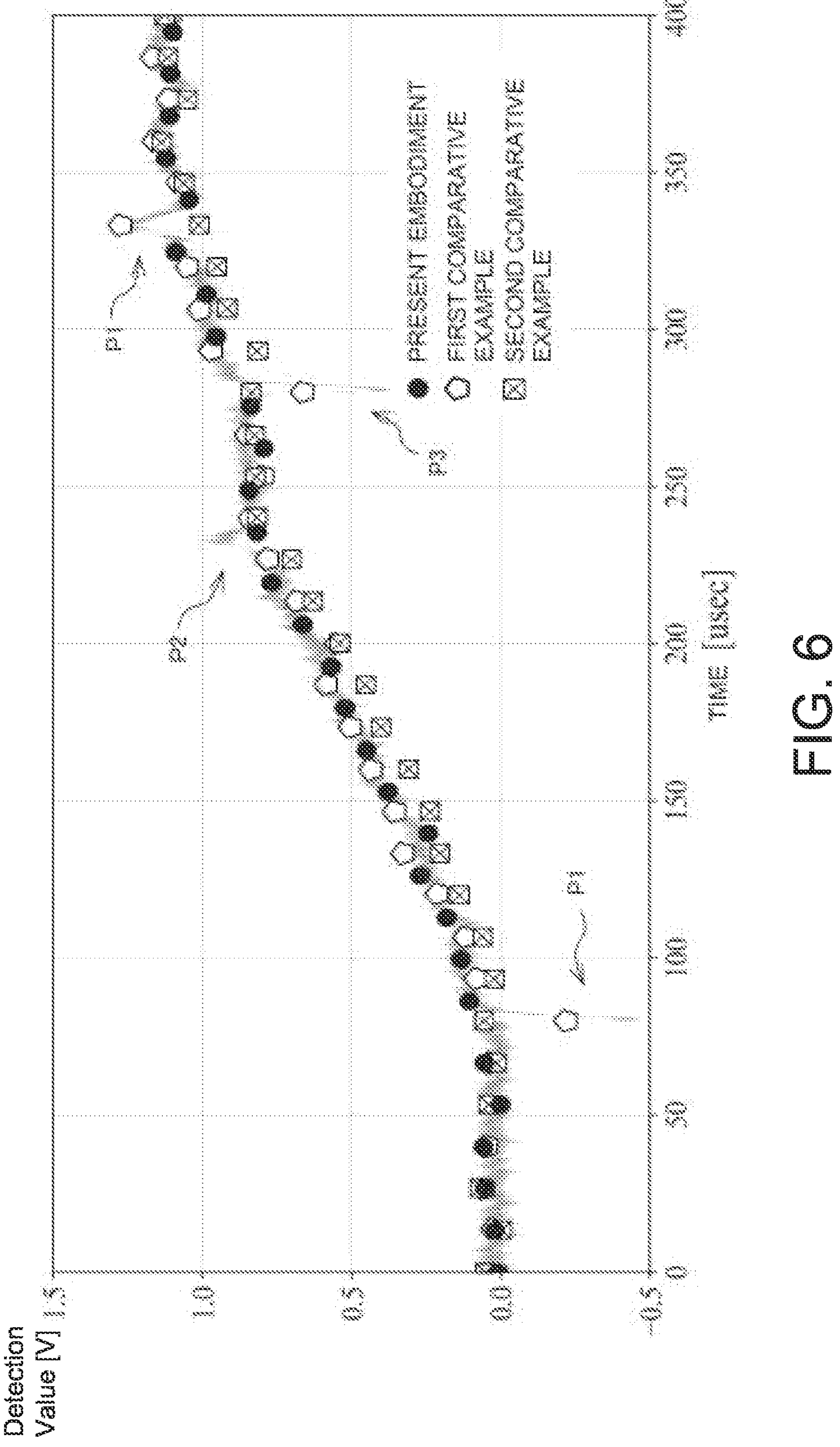
FIG. 6 is a diagram illustrating a sampling value of a signal output from an amplifier circuit.

FIG. 6 is a diagram illustrating an example of a digital signal output from the current detection circuit 1 in a double-path test.

In FIG. 6, a current detection value obtained by the current detection circuit 1 of the present embodiment is indicated by a round shape, and a current detection value obtained by a detection circuit that samples the main signal at a constant cycle as a first comparative example is indicated by a white pentagonal shape. Further, a current detection value obtained by a general detection circuit using the LPF circuit described above as a second comparative example is indicated by a square shape.

As illustrated in FIG. 6, regarding the current detection value of the first comparative example, the current detection value is particularly affected by high-frequency noise at time points P1 to P4 when switching noise generated in an irregular manner is superimposed on the detection current.

In addition, regarding the current detection value of the second comparative example, for example, the current detection value is affected by high-frequency noise caused by the amplifier circuit 12 or the like between 100 [μsec] and 200 [μsec]. In addition, due to a delay caused by signal processing in the LPF circuit, the current detection value of the second comparative example increases with a delay so as to follow an increase in the current detection value of the first comparative example.

In contrast, the current detection value of the present embodiment is not affected by the high-frequency noise compared to the current detection values of the first comparative example and the second comparative example, and a detection error caused by the high-frequency noise is suppressed.

The current detection circuit 1 that outputs the current detection value according to the present embodiment does not require an LPF circuit. Therefore, a delay time of the current detection value of the present embodiment is shorter than that of the current detection value of the second comparative example. In this test, the delay time related to the current detection value of the present embodiment is reduced by about several tens of microseconds with respect to the current detection value of the second comparative example.

Next, functions and effects of the first application example of the second embodiment will be described.

In the present application example, the current detection circuit 1 detects the input current, the internal current, or the output current of the power conversion device 2A configured by a switching circuit having one switching element or the plurality of switching elements 21 to 26.

According to this configuration, in the current detection circuit 1, the HPF circuit 14 extracts the switching noise caused by a switching operation of the one switching element or the plurality of switching elements 21 to 26. The comparison circuit 15 generates a comparison signal indicating a noise detection timing at which the output signal of the HPF circuit 14 exceeds the predetermined reference value Vref, and the sampling timing by the AD conversion circuit 13 is delayed by a predetermined time by the arithmetic circuit 16 based on the comparison signal.

Accordingly, the influence of the high-frequency noise can be suppressed since sampling is executed so as to avoid the high-frequency noise caused by the amplifier circuit 12 and the irregular switching noise caused by the switching elements 21 to 26. Therefore, the current can be accurately detected.

Further, according to the above-mentioned configuration, since the current detection circuit 1 does not require an LPF circuit in which a signal delay occurs, and a process of delaying the sampling timing is adopted as necessary, the signal delay in the current detection circuit 1 is suppressed. Therefore, in the current control that requires control in real time, the current supplied from the power conversion device 2A to the motor 3A can be accurately controlled.

In addition, in the second embodiment, the power conversion device 2A is mounted on the vehicle, and the resistors 112 to 114 as output circuits are shunt resistors configured by the pair of electrode plates E1 and E2 which are metal plates or the wiring L as illustrated in FIG. 4A or FIG. 4B.

According to this configuration, since the power conversion device 2A is mounted on the vehicle, an installation space of the current detection circuit 1 is likely to be limited, and for example, when a current detection element such as a hall element is used to detect a current, it may be difficult to dispose the hall element.

In contrast, the current detection circuit 1 can be reduced in height by adopting plate-shaped shunt resistors as the resistors 112 to 114. Therefore, the current detection circuit 1 can be disposed even in a narrow space in the vehicle, and the influence of the high-frequency noise generated in the power conversion device 2A can be suppressed as described above. That is, it is possible to achieve both reduction in height and improvement in detection accuracy of the current detection circuit 1.

Next, a second application example of the current detection circuit 1 will be described with reference to FIG. 7.

Figure 7:
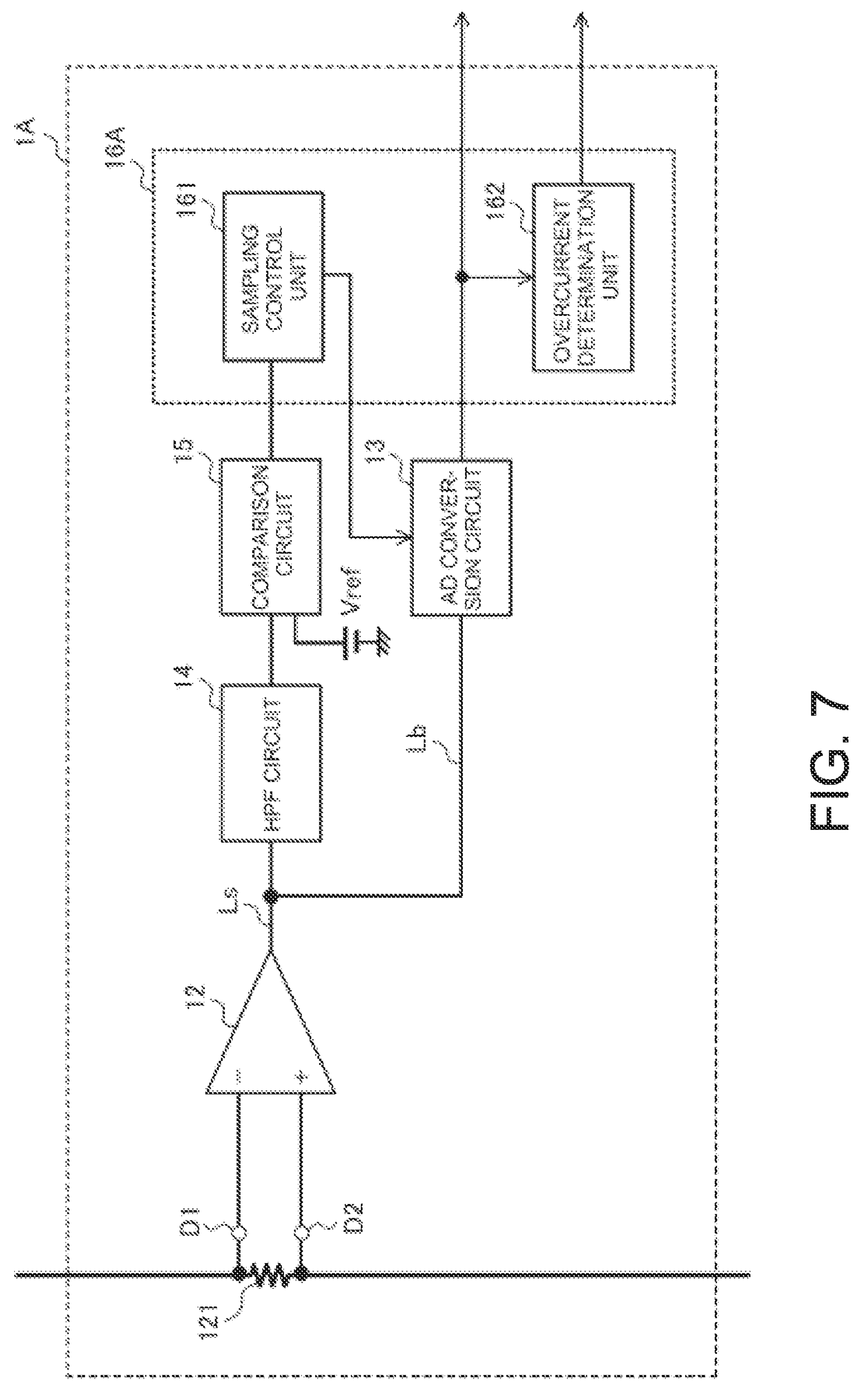
FIG. 7 is a diagram illustrating a second application example of the current detection circuit.

FIG. 7 is a block diagram illustrating a functional configuration example of a current detection circuit 1A according to the second application example. The current detection circuit 1A is also applied to the current control system 200.

The current detection circuit 1A detects any one of currents flowing through the resistors 121 to 127 for overcurrent detection. In FIG. 7, a current flowing through the resistor 121 is detected in the current detection circuit 1A as an example.

An arithmetic circuit 16A in the second application example includes a sampling control unit 161 and an overcurrent determination unit 162.

The sampling control unit 161 has the same or equivalent function as the arithmetic circuit 16 of the first embodiment. Specifically, the sampling control unit 161 delays a timing at which the main signal is sampled by the AD conversion circuit 13 by a minute time based on the comparison signal generated by the comparison circuit 15.

The overcurrent determination unit 162 determines presence or absence of an overcurrent flowing through the resistor based on the digital signal output from the AD conversion circuit 13. For example, the overcurrent determination unit 162 determines whether a current detection value indicated by the digital signal exceeds a predetermined range.

The overcurrent determination unit 162 determines that an overcurrent has occurred when the current detection value exceeds the predetermined range, and determines that an overcurrent has not occurred when the current detection value falls within the predetermined range.

Next, a method of determining the presence or absence of an overcurrent flowing through the resistors 121 to 127 will be described with reference to FIG. 8.

Figure 8:
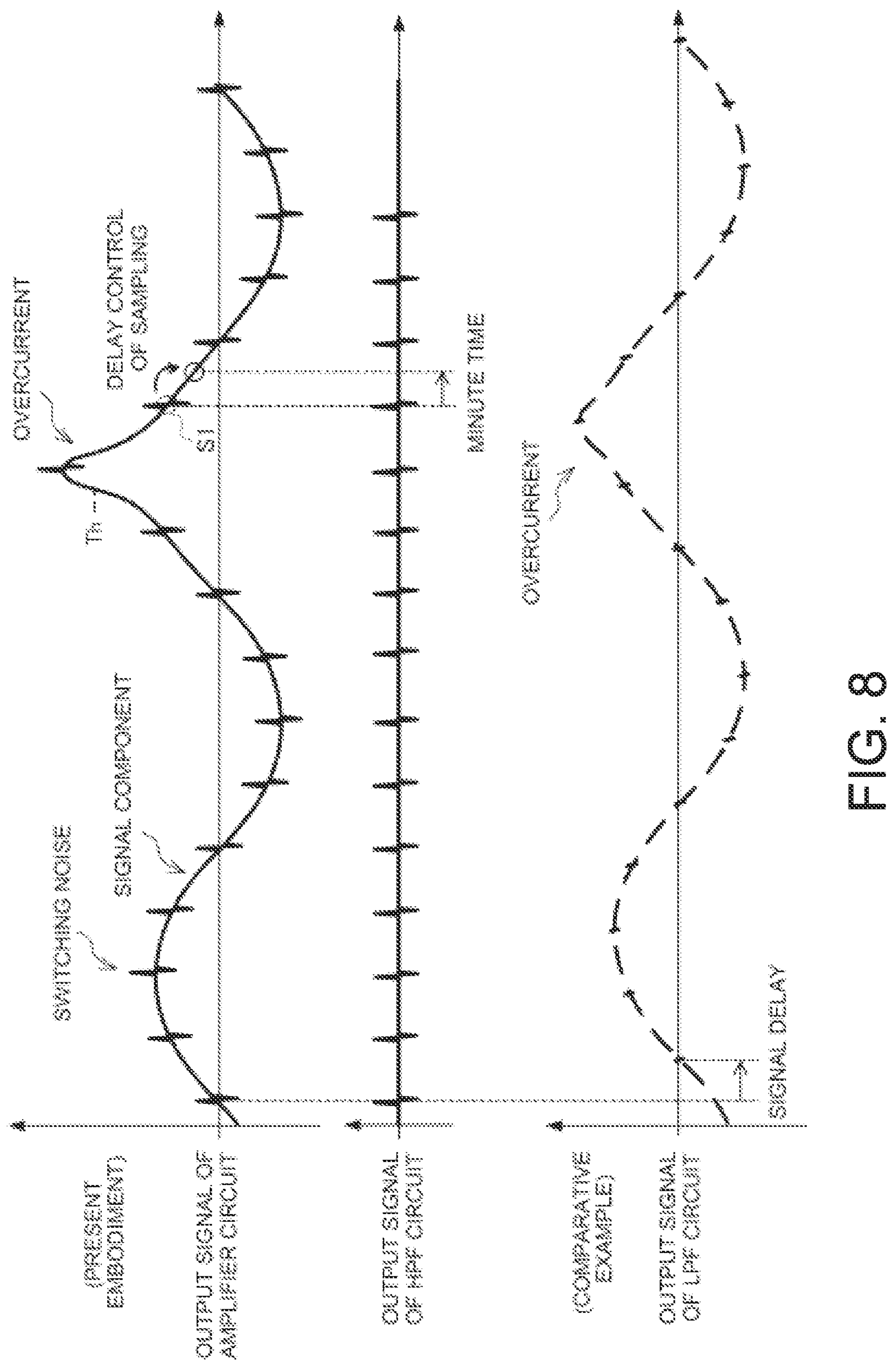
FIG. 8 is a diagram for illustrating a detection accuracy of an overcurrent according to the second embodiment.

FIG. 8 is a diagram illustrating a waveform of a master signal output from the amplifier circuit 12 and a waveform of the output signal of the HPF circuit 14. In FIG. 8, for ease of understanding, a delay control at a time S1 is illustrated in relation to sampling of the master signal, and a waveform of a detection signal according to the general circuit configuration using the LPF circuit is illustrated by a broken line as a comparative example of overcurrent determination.

As illustrated in FIG. 8, in the output signal of the amplifier circuit 12, the switching noise is superimposed on a signal component indicating a magnitude of the current flowing through the resistor, and an overcurrent in which the signal component sharply increases occurs.

At the time S1, in the comparison circuit 15, the output signal of the HPF circuit 14 exceeds the predetermined reference value Vref, and a High signal indicating the noise detection timing is output. Then, the sampling timing of the AD conversion circuit 13 is delayed by a minute time from a predetermined sampling cycle by the arithmetic circuit 16 that has acquired the High signal.

Accordingly, since the sampling is executed so as to avoid high-frequency noise, the high-frequency noise is removed from the digital signal of the present embodiment without affecting the waveform indicating the overcurrent to be determined.

Therefore, since the digital signal indicating the current detection value in the overcurrent determination unit 162 exceeds a threshold value Th, it is determined that an overcurrent has occurred.

On the other hand, in the comparative example, although the high-frequency noise is removed by the LPF circuit, a high-frequency component of the overcurrent to be determined is also removed, and therefore, the detection signal when an overcurrent occurs is subjected to a filtering process so as to show a standard waveform. As a result, it is difficult to determine an occurrence of the overcurrent.

Further, in the comparative example, since signal processing is executed in the LPF circuit, a signal delay occurs. As a result, even when the occurrence of the overcurrent can be detected, execution of the current control is delayed.

As described above, in the second application example of the present embodiment, it is possible to accurately detect the overcurrent while suppressing the influence of the high-frequency noise. In addition, it is possible to quickly execute the current control according to a signal fluctuation.

Next, functions and effects of the second application example of the second embodiment will be described.

In the second application example, the power conversion device 2A includes a switching circuit, and the arithmetic circuit 16 determines presence or absence of an overcurrent in a current flowing in any one of the resistors 121 to 127 based on the digital signal output from the AD conversion circuit 13.

According to this configuration, the influence of the high-frequency noise such as the switching noise caused by the switching elements 21 to 26 of the power conversion device 2A can be suppressed without affecting the detection of the overcurrent occurring in the power conversion device 2A. That is, it is possible to accurately detect the overcurrent while removing the high-frequency noise.

Although the embodiment of the present invention has been described above, the above embodiment is merely a part of application examples of the present invention, and is not intended to limit the technical scope of the present invention to the specific configurations of the above embodiment.

The present application claims priority based on Japanese Patent Application No. 2023-012778 filed on Jan. 31, 2023, the entire contents of which are incorporated into this specification by reference.

DESCRIPTION OF REFERENCE SIGNS

1, 1A current detection circuit
2A power conversion device (switching circuit)
11, 111 to 114, 121 to 127 resistor (output circuit)
12 amplifier circuit
13 AD conversion circuit (conversion circuit)
14 HPF circuit (filter circuit)
15 comparison circuit (comparing unit)
16, 16A arithmetic circuit
21 to 26 switching element
D1, D2 detection terminal
Ls signal line
Lb branch line

What is claimed is:

1. A current detection circuit, comprising:
- an output circuit configured to output a signal indicating a voltage drop between a pair of detection terminals for detecting a current;
- an amplifier circuit configured to amplify the signal from the output circuit;
- a conversion circuit configured to generate a digital signal by sampling, at a predetermined cycle, an amplified signal amplified by the amplifier circuit;
- a filter circuit configured to extract, from the amplified signal, a noise component having a frequency higher than a sampling frequency of the conversion circuit;
- a comparing unit configured to output a comparison signal indicating a noise detection timing at which an output signal of the filter circuit exceeds a predetermined reference value for detecting the noise component; and an arithmetic circuit configured to delay a timing at which the amplified signal is sampled by the conversion circuit for a predetermined time based on the comparison signal.

2. The current detection circuit according to claim 1, wherein the current detection circuit detects an input current, an internal current, or an output current of a switching circuit including one switching element or a plurality of switching elements.

3. The current detection circuit according to claim 2, wherein the switching circuit is provided in a power conversion device, and the arithmetic circuit determines presence or absence of an overcurrent flowing through the power conversion device based on the digital signal.

4. The current detection circuit according to claim 3, wherein the power conversion device is mounted on a vehicle, and the output circuit is a shunt resistor formed of a metal plate.

5. The current detection circuit according to claim 1, wherein the predetermined time is a time interval shorter than the predetermined cycle.

6. The current detection circuit according to claim 1, wherein the comparing unit is a comparator that outputs the comparison signal with a binary digital value.

7. The current detection circuit according to claim 1, wherein the output circuit includes a shunt resistor having a low resistance value.

* * * * *